US012563898B2

(12) United States Patent
Yuan et al.

(10) Patent No.: US 12,563,898 B2
(45) Date of Patent: Feb. 24, 2026

(54) DISPLAY PANEL AND METHOD FOR MANUFACTURING THE SAME, AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Zhidong Yuan, Beijing (CN); Pan Xu, Beijing (CN); Jun Liu, Beijing (CN); Can Yuan, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 637 days.

(21) Appl. No.: 17/914,686

(22) PCT Filed: Nov. 18, 2021

(86) PCT No.: PCT/CN2021/131547
§ 371 (c)(1),
(2) Date: Sep. 26, 2022

(87) PCT Pub. No.: WO2022/242073
PCT Pub. Date: Nov. 24, 2022

(65) Prior Publication Data
US 2024/0268148 A1    Aug. 8, 2024

(30) Foreign Application Priority Data
May 21, 2021    (CN) ......................... 202110558662.0

(51) Int. Cl.
| | |
|---|---|
| *H10K 59/121* | (2023.01) |
| *H10K 59/12* | (2023.01) |
| *H10K 59/131* | (2023.01) |

(52) U.S. Cl.
CPC ..... *H10K 59/1213* (2023.02); *H10K 59/1201* (2023.02); *H10K 59/1216* (2023.02); *H10K 59/131* (2023.02)

(58) Field of Classification Search
CPC .......... H10K 59/1213; H10K 59/1201; H10K 59/1216; H10K 59/131; H10K 59/1315;
(Continued)

(56) References Cited

U.S. PATENT DOCUMENTS

| | | | |
|---|---|---|---|
| 5,686,935 A | 11/1997 | Weisbrod | |
| 2002/0140876 A1 | 10/2002 | Yoo et al. | |

(Continued)

FOREIGN PATENT DOCUMENTS

| | | | | |
|---|---|---|---|---|
| CN | 1928683 A | 3/2007 | | |
| CN | 101118913 A | * 2/2008 | .......... | G02F 1/1368 |

(Continued)

OTHER PUBLICATIONS

Translated specification of CN-101118913-A by Kazushi (Year: 2008).*

(Continued)

*Primary Examiner* — Bumsuk Won
(74) *Attorney, Agent, or Firm* — XSENSUS LLP

(57) ABSTRACT

A display panel includes a plurality of sub-pixels, a sub-pixel includes a pixel driving circuit, and the pixel driving circuit includes at least a driving transistor and a storage capacitor. The display panel further includes a substrate, and a first gate conductive layer, a semiconductor layer and a second gate conductive layer that are disposed on the substrate. The first gate conductive layer includes a first (Continued)

electrode plate of the storage capacitor. The semiconductor layer includes an active layer pattern of the driving transistor. At least part of the active layer pattern of the driving transistor and at least part of the first electrode plate are disposed in a same layer. The second gate conductive layer includes a second electrode plate of the storage capacitor and a gate electrode of a driving transistor electrically connected to the second electrode plate.

17 Claims, 8 Drawing Sheets

(58) Field of Classification Search
CPC .... H10D 1/692; H10D 30/673; H10D 64/517; H10D 86/0221; H10D 86/421; H10D 86/60
USPC .......................................................... 257/40
See application file for complete search history.

(56) References Cited

U.S. PATENT DOCUMENTS

| | | | |
|---|---|---|---|
| 2008/0029767 A1 | 2/2008 | Nagata et al. | |
| 2008/0218455 A1 | 9/2008 | Yamamoto et al. | |
| 2010/0176381 A1 | 7/2010 | Yagi et al. | |
| 2016/0260750 A1 | 9/2016 | Ueda et al. | |
| 2020/0303421 A1 | 9/2020 | Cho et al. | |
| 2022/0013612 A1 | 1/2022 | Xu et al. | |
| 2023/0006023 A1 | 1/2023 | Yuan et al. | |

FOREIGN PATENT DOCUMENTS

| | | | | |
|---|---|---|---|---|
| CN | 110929667 A | | 3/2020 | |
| CN | 111354775 A | | 6/2020 | |
| CN | 111725262 A | * | 9/2020 | ........... G09G 3/3208 |
| CN | 112366226 A | * | 2/2021 | ........ H01L 27/1225 |
| IN | 113299747 A | | 8/2021 | |
| JP | 2002297059 A | | 10/2002 | |
| JP | 5509659 B2 | | 6/2014 | |
| KR | 20210050144 A | * | 5/2021 | ............. H10K 59/87 |

OTHER PUBLICATIONS

Translated specification of CN-111725262-A by Bian (Year: 2020).*
Translated specification of CN-112366226-A by Chen (Year: 2021).*
Translated specification of KR-20210050144-A by Choi (Year: 2021).*
First Office Action issued for Chinese Patent Application No. 202110558662.0 by the Chinese Patent Office on Sep. 21, 2022.
Second Office Action issued for Chinese Patent Application No. 202110558662.0 by the Chinese Patent Office on Feb. 8, 2023.
Reexamination Decision for the Chinese Patent Application No. 202110558662.0 issued by theon Feb. 29, 2024.

* cited by examiner

B-B

B-B

C-C

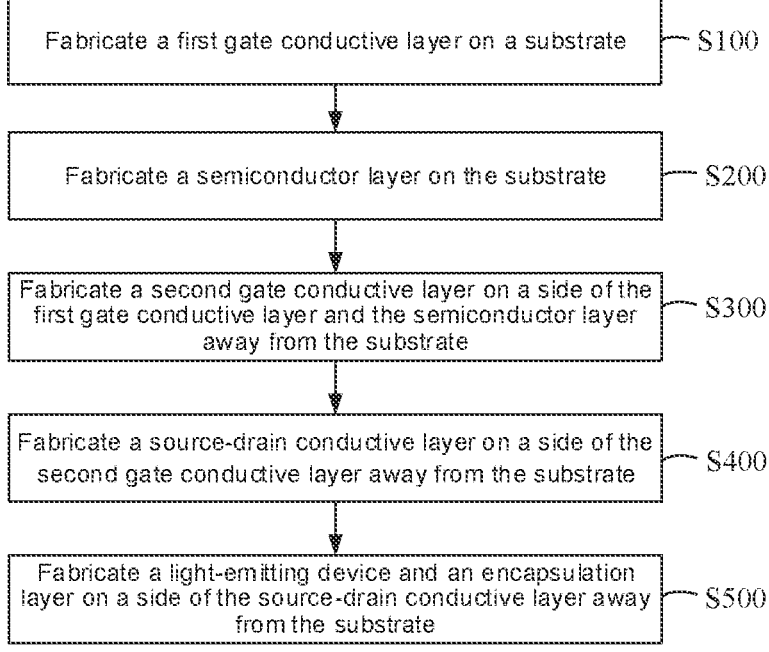

| Fabricate a first gate conductive layer on a substrate | — S100 |

| Fabricate a semiconductor layer on the substrate | — S200 |

| Fabricate a second gate conductive layer on a side of the first gate conductive layer and the semiconductor layer away from the substrate | — S300 |

| Fabricate a source-drain conductive layer on a side of the second gate conductive layer away from the substrate | — S400 |

| Fabricate a light-emitting device and an encapsulation layer on a side of the source-drain conductive layer away from the substrate | — S500 |

FIG. 9

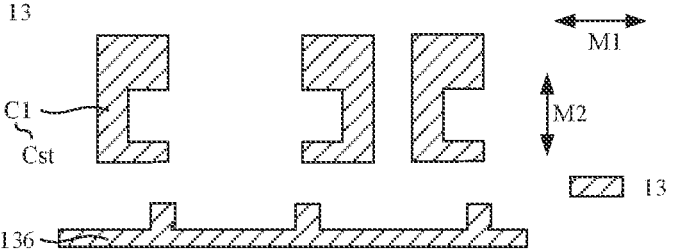

FIG. 10A

DISPLAY PANEL AND METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2021/131547, filed on Nov. 18, 2021, which claims priority to Chinese Patent Application No. 202110558662.0, filed on May 21, 2021, which are incorporated herein by reference in their entirety.

TECHNICAL FIELD

The present disclosure relates to the field of display technologies, and in particular, to a display panel and a method for manufacturing the same, and a display apparatus.

BACKGROUND

Organic light-emitting diode (OLED) display panels are widely used in the industry due to their characteristics of self-luminescence, wide viewing angle, high contrast, fast response speed, low power consumption, ultra-thin and the like. A display panel with high resolution and high pixel density has become an important direction for the development of the display panel due to its clearer picture display effect.

SUMMARY

In an aspect, a display panel is provided. The display panel includes a plurality of sub-pixels, and a sub-pixel includes a pixel driving circuit including at least a driving transistor and a storage capacitor. The display panel further includes a substrate, a first gate conductive layer, a semiconductor layer and a second gate conductive layer. The first gate conductive layer is disposed on the substrate and includes a first electrode plate of the storage capacitor. The semiconductor layer is disposed on the substrate and includes an active layer pattern of the driving transistor. At least part of the active layer pattern of the driving transistor and at least part of the first electrode plate are disposed in a same layer. The second gate conductive layer is disposed on a side of the first gate conductive layer and the semiconductor layer away from the substrate, and includes a second electrode plate of the storage capacitor and a gate of the driving transistor electrically connected to the second electrode plate.

In some embodiments, the first electrode plate is in direct contact with and electrically connected to the active layer pattern of the driving transistor.

In some embodiments, an orthogonal projection of the first electrode plate on the substrate partially overlaps with an orthogonal projection of the active layer pattern of the driving transistor on the substrate.

In some embodiments, a portion, whose orthogonal projection on the substrate overlapping with the orthogonal projection of the active layer pattern of the driving transistor on the substrate, of the first electrode plate is located on a side of the active layer pattern of the driving transistor proximate to the substrate.

In some embodiments, a portion, whose orthogonal projection on the substrate overlapping with the orthogonal projection of the active layer pattern of the driving transistor on the substrate, of the first electrode plate is located on a side of the active layer pattern of the driving transistor away from the substrate.

In some embodiments, the pixel driving circuit further includes a first initialization transistor. The semiconductor layer further includes an active layer pattern of the first initialization transistor. At least part of the active layer pattern of the first initialization transistor and the at least part of the first electrode plate are disposed in a same layer, and the active layer pattern of the first initialization transistor is in direct contact with and electrically connected to the first electrode plate. The second gate conductive layer further includes a gate of the first initialization transistor.

In some embodiments, an orthogonal projection of the first electrode plate on the substrate partially overlaps with an orthogonal projection of the active layer pattern of the first initialization transistor on the substrate.

In some embodiments, a portion, whose orthogonal projection on the substrate overlapping with the orthogonal projection of the active layer pattern of the first initialization transistor on the substrate, of the first electrode plate is located on a side of the active layer pattern of the first initialization transistor proximate to the substrate.

In some embodiments, the display panel further includes a source-drain conductive layer, a first insulating layer and a second insulating layer. The source-drain conductive layer is disposed on a side of the second gate conductive layer away from the substrate, and includes a first connection pattern. The first insulating layer is disposed between the second gate conductive layer and both the semiconductor layer and the first gate conductive layer. The second insulating layer is disposed between the second gate conductive layer and the source-drain conductive layer, and the second insulating layer being provided with a plurality of first via holes therein. The first connection pattern is electrically connected to the second electrode plate through at least one first via hole.

In some embodiments, the pixel driving circuit further includes a data writing transistor and a second initialization transistor. The semiconductor layer further includes: an active layer pattern of the data writing transistor including a source contact region and a drain contact region, and an active layer pattern of the second initialization transistor including a source contact region and a drain contact region. The first insulating layer and the second insulating layer are provided with a plurality of second via holes therein. The first connection pattern is electrically connected to the source contact region or the drain contact region of the active layer pattern of the data writing transistor through at least one second via hole, and the first connection pattern is electrically connected to the source contact region or the drain contact region of the active layer pattern of the second initialization transistor through another at least one second via hole.

In some embodiments, the display panel further includes a light-emitting device; the first insulating layer and the second insulating layer are provided with a plurality of third via holes therein, and the active layer pattern of the first initialization transistor includes a source contact region and a drain contact region. The source-drain conductive layer further includes a second connection pattern. The second connection pattern is electrically connected to the source contact region or the drain contact region of the active layer pattern of the first initialization transistor through at least one third via hole. The second connection pattern is configured to be electrically connected to the light-emitting device of the display panel.

In some embodiments, the pixel driving circuit further includes a control transistor. The semiconductor layer further includes an active layer pattern of the control transistor including a source contact region and a drain contact region, the active layer pattern of the driving transistor includes a source contact region and a drain contact region. The first insulating layer and the second insulating layer are provided with a plurality of fourth via holes. The source-drain conductive layer further includes a third connection pattern, and the third connection pattern is electrically connected to the source contact region or the drain contact region of the active layer pattern of the control transistor through at least one fourth via hole, and is electrically connected to the source contact region or the drain contact region of the active layer pattern of the driving transistor through at least one fourth via hole.

In some embodiments, the plurality of sub-pixels are arranged in a plurality of rows and columns, each row of sub-pixels includes sub-pixels arranged in a first direction, and each column of sub-pixels includes sub-pixels arranged in a second direction. The source-drain conductive layer further includes voltage signal lines, data signal lines, first initialization signal lines and second initialization signal lines that each extending in the second direction. Each column of sub-pixels are electrically connected to a corresponding data signal line, and at least two columns of sub-pixels are disposed between two adjacent voltage signal lines, between two adjacent first initialization signal lines, and between two adjacent second initialization signal lines. The first gate conductive layer further includes a first transition line extending in the first direction, and the first transition line is electrically connected to a first initialization signal line. The semiconductor layer further includes a second transition line extending in the first direction, and the second transition line is electrically connected to a second initialization signal line. The second gate conductive layer further includes a third transition line extending in the first direction, and the third transition line is electrically connected to a voltage signal line.

In some embodiments, the pixel driving circuit further includes a data writing transistor, a second initialization transistor, and a control transistor, and the semiconductor layer further includes: an active layer pattern of the data writing transistor, an active layer pattern of the second initialization transistor including a source contact region and a drain contact region, and an active layer pattern of the control transistor including a source contact region and a drain contact region. The source contact region or the drain contact region of the active layer pattern of the first initialization transistor is electrically connected to the first transition line. The source contact region or the drain contact region of the active layer pattern of the data writing transistor is electrically connected to the data signal line. The source contact region or the drain contact region of the active layer pattern of the second initialization transistor is electrically connected to the second transition line. The source contact region or the drain contact region of the active layer pattern of the control transistor is electrically connected to the third transition line.

In some embodiments, the first insulating layer and the second insulating layer are provided with a plurality of fifth via holes therein. The source-drain conductive layer further includes a fourth connection pattern, and the fourth connection pattern is electrically connected to the first transition line through at least one fifth via hole, and is electrically connected to the source contact region or the drain contact region of the active layer pattern of the first initialization transistor through another at least one fifth via hole.

In some embodiments, the source contact region or the drain contact region of the active layer pattern of the first initialization transistor is in direct contact with and electrically connected to the third transition line.

In another aspect, a display apparatus is provided, which includes the display panel as described in any one of the above embodiments.

In yet another aspect, a method for manufacturing a display panel is provided. The display panel includes a plurality of sub-pixels, a sub-pixel includes a pixel driving circuit, and the pixel driving circuit includes at least a driving transistor and a storage capacitor. The manufacturing method includes: fabricating a first gate conductive layer on a substrate, fabricating a semiconductor layer on the substrate, and fabricating a second gate conductive layer on a side of the first gate conductive layer and the semiconductor layer away from the substrate. The first gate conductive layer includes a first electrode plate of the storage capacitor. The semiconductor layer includes an active layer pattern of the driving transistor, and at least part of the active layer pattern of the driving transistor and at least part of the first electrode plate being disposed in a same layer. The second gate conductive layer includes a second electrode plate of the storage capacitor and a gate of the driving transistor electrically connected to the second electrode plate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these accompanying drawings. In addition, the accompanying drawings in the following description may be regarded as schematic diagrams, and are not limitations on actual sizes of products, actual processes of methods and actual timings of signals involved in the embodiments of the present disclosure.

FIG. 9 is a flow diagram showing steps of manufacturing a display panel, in accordance with some embodiments;

FIG. 10A is a schematic diagram showing a step of fabricating a first gate conductive layer of a display penal;

DETAILED DESCRIPTION

Figure 1:
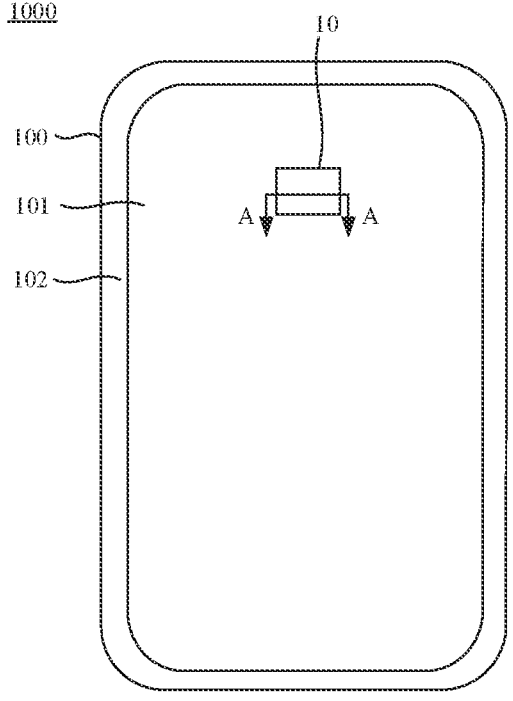
FIG. 1 is a structural diagram of a display panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "some embodiments", "exemplary embodiments" or "example" are intended to indicate that specific features, structures, or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the terms "electrically connected" and "connected" and their derivatives may be used. For example, the term "connected" may be used in the description of some embodiments to indicate that two or more components are in direct physical or electrical contact with each other.

The use of the phrase "configured to" herein indicates an open and inclusive expression, which does not exclude devices that are applicable to or configured to perform additional tasks or steps.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Referring to FIG. 1, some embodiments of the present disclosure provide a display apparatus 1000, which may be any product or component having a display function, such as a television, a display, a notebook computer, a tablet computer, a mobile phone or a navigator.

In some embodiments, the display apparatus 1000 may be an electroluminescent display apparatus or a photoluminescent display apparatus. In a case where the display apparatus is an electroluminescent display apparatus, the electroluminescent display apparatus may be an organic light-emitting diode (OLED) display apparatus or a quantum dot light-emitting diode (QLED) display apparatus. In a case where the display apparatus 1000 is a photoluminescent display apparatus, the photoluminescent display apparatus may be a quantum dot photoluminescent display apparatus.

Referring to FIG. 1, the display apparatus 1000 includes a display panel 100. The display panel 100 has a display area 101 and a peripheral area 102, and the peripheral area 102 may surround the display area 101 (as shown in FIG. 1), or may only be located on one or more sides of the display area 101.

Figure 2:
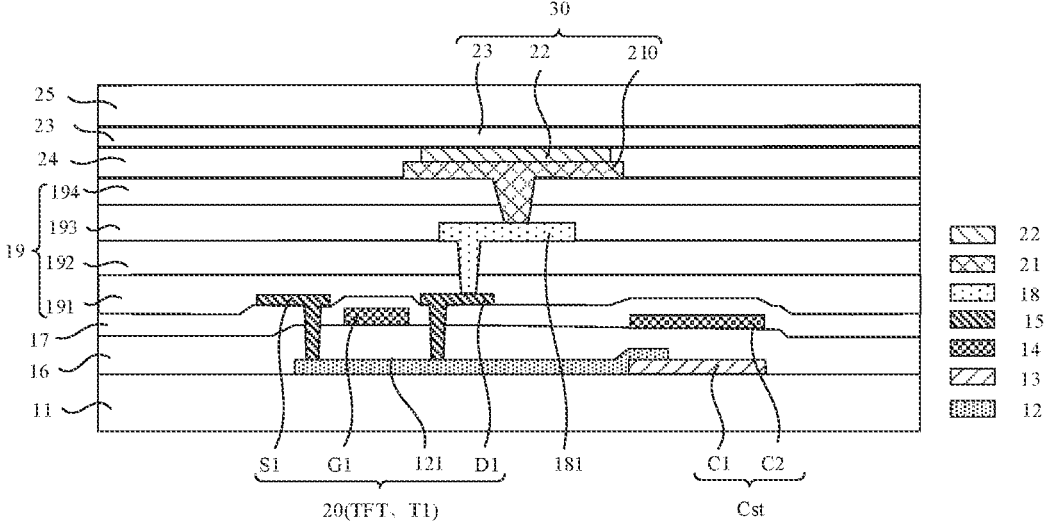
FIG. 2 is a sectional view of the display panel in FIG. 1 taken along the line A-A.

The display area 101 of the display panel 100 is provided with a plurality of sub-pixels 10 arranged in an array therein, and the plurality of sub-pixels 10 play a role of displaying images. Referring to FIG. 2, FIG. 2 is a sectional view of a thin film transistor (a driving transistor) of a sub-pixel 10 in the display area 101 in FIG. 1. Each sub-pixel 10 includes a pixel driving circuit 20 and a light-emitting device 30 that are disposed on a substrate 11. The pixel driving circuit 20 includes a plurality of thin film transistors TFT and a storage capacitor Cst.

Referring to FIG. 2, the display panel 100 includes a semiconductor layer 12, a first gate conductive layer 13, a second gate conductive layer 14 and a source-drain conductive layer 15 that are disposed on the substrate 11.

The second gate conductive layer 14 is disposed on a side of the semiconductor layer 12 away from the substrate 11, and the first gate conductive layer 13 is disposed on a side of the second gate conductive layer 14 proximate to the substrate 11. The semiconductor layer 12 and the second gate conductive layer 14 are provided with at least one insulating layer therebetween, and the first gate conductive layer 13 and the second gate conductive layer 14 are provided with at least one insulating layer therebetween.

Figure 3:
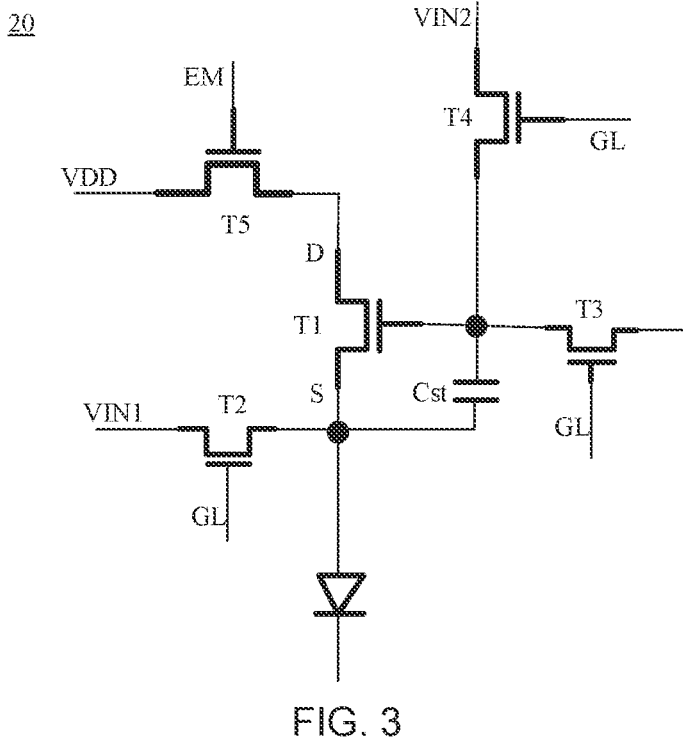
FIG. 3 is an equivalent circuit diagram of a pixel driving circuit, in accordance with some embodiments.

Some embodiments of the present disclosure provide a display panel. As shown in FIGS. 2 and 3, the pixel driving circuit 20 includes at least a driving transistor T1 and the storage capacitor Cst. As shown in FIG. 2, the display panel 100 includes the substrate 11, the first gate conductive layer 13, the semiconductor layer 12 and the second gate conductive layer 14.

Figure 5:
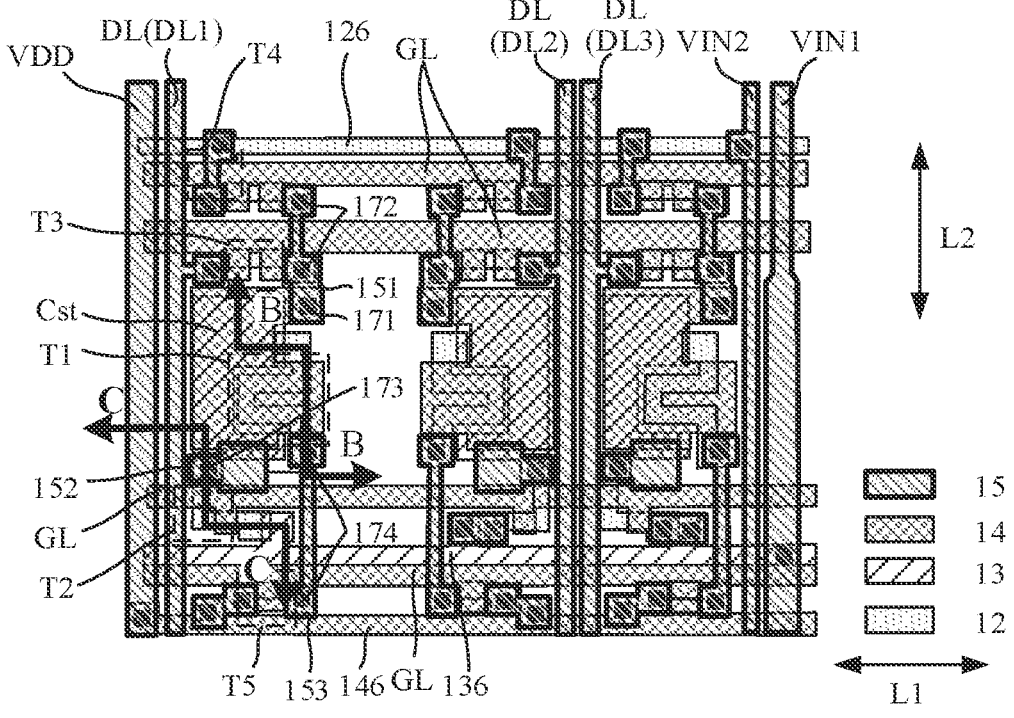
FIG. 5 is a layout of a pixel driving circuit, in accordance with some embodiments.
Figure 6A:
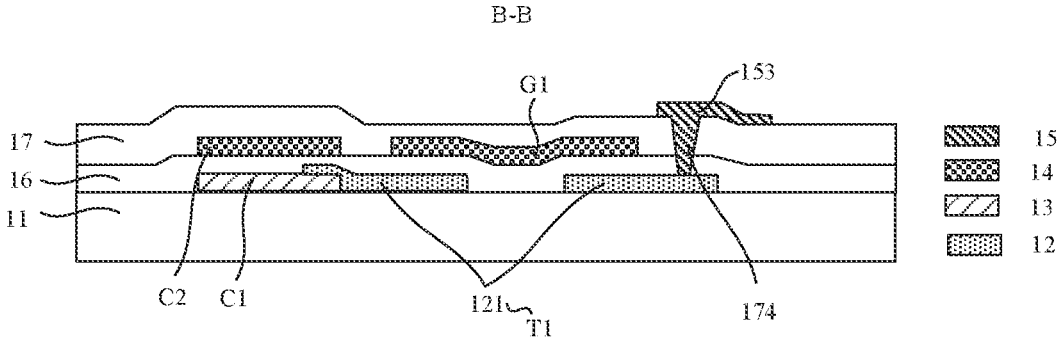
FIG. 6A is a sectional view of the pixel driving circuit in FIG. 5 taken along the line B-B.

Referring to FIGS. 5 and 6A, the first gate conductive layer 13 is disposed on the substrate 11 and includes a first electrode plate C1 of the storage capacitor Cst. The semiconductor layer 12 is disposed on the substrate 11 and includes an active layer pattern 121 of the driving transistor T1. At least part of the first electrode plate C1 and at least part of the active layer pattern 121 of the driving transistor T1 are disposed in the same layer. That is, at least part of the first gate conductive layer 13 and at least part of the semiconductor layer 12 are located in the same film layer, and there is no insulating layer between a film layer where the first gate conductive layer 13 is located and a film layer where the semiconductor layer 12 is located.

A and B are disposed in the same layer, which means that in a thickness direction of the display panel 100, a film layer adjacent to A and a film layer adjacent to B are a same film layer. For example, a side of A proximate to the substrate 11 is in direct contact with a first film layer, and a side of A away from the substrate 11 is in direct contact with a second film layer; then, a side of B proximate to the substrate 11 is in direct contact with the first film layer, and a side of B away from the substrate 11 is in direct contact with the second film layer. A and B may be formed through different processes.

Referring to FIGS. 5 and 6A, the second gate conductive layer 14 is disposed on a side of the first gate conductive layer 13 and the semiconductor layer 12 away from the substrate 11, and includes a second electrode plate C2 of the storage capacitor Cst and a gate G1 of the driving transistor T1 electrically connected to the second electrode plate C2.

In the display panel 100 provided by the embodiments of the present disclosure, referring to FIGS. 5 and 6A, at least part of the first gate conductive layer 13 and at least part of the semiconductor layer 12 are located in the same film layer, and there is no insulating layer between the film layer where the first gate conductive layer 13 is located and the film layer where the semiconductor layer 12 is located. In this way, it may be possible to omit the fabrication of at least one insulating layer, and simplify the manufacturing processes of the display panel 100; as a result, it may be possible to improve the manufacturing efficiency of the display panel 100, and reduce the manufacturing costs of the display panel 100.

In some embodiments, referring to FIG. 2, the first electrode plate C1 is in direct contact with and electrically connected to the active layer pattern 121 of the driving transistor T1.

Referring to FIG. 3, FIG. 3 is an equivalent circuit diagram of a pixel driving circuit 20, and a frame cycle of the light-emitting device 30 includes a reset phase, a scanning phase and a light-emitting phase. The driving transistor T1 is configured to drive the light-emitting device 30 to emit light in the light-emitting phase. Referring to FIG. 2, an electrode plate of the storage capacitor Cst is electrically connected to a source contact region (a source) S1 or a drain contact region (a drain) D1 of the driving transistor T1. The storage capacitor Cst is configured to store data signals in the scanning phase and maintain a voltage of the gate of the driving transistor T1 during the light-emitting phase, so that the light-emitting device 30 is able to emit light continuously and stably during the light-emitting phase in a frame.

The source and the drain of the thin film transistor TFT may be symmetrical in structure, so there may be no difference in structure between the source contact region S1 and the drain contact region D1 of the thin film transistor.

Figure 4:
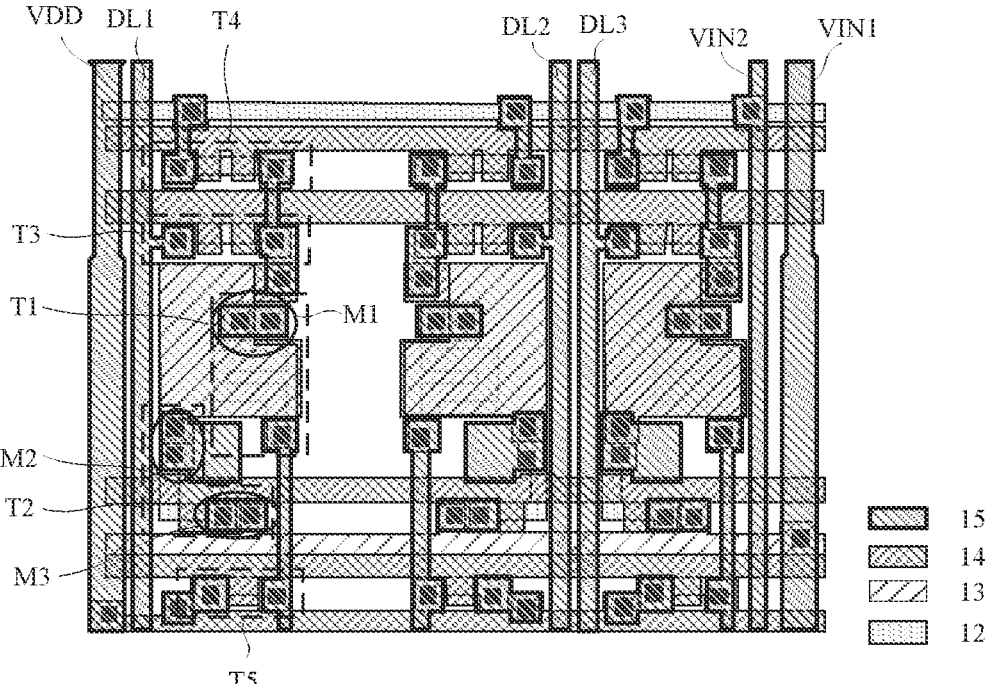
FIG. 4 is a layout of a pixel driving circuit in the related art.

In the related art, referring to FIG. 4, since the electrode plate of the storage capacitor and the active layer pattern of the driving transistor T1 are not in the same film layer, the electrode plate of the storage capacitor cannot be electrically connected to the source contact region or the drain contact region of the driving transistor T1 directly. There is a need to provide a connection pattern M1 on the source-drain conductive layer 15, the connection pattern is electrically connected to an electrode plate of the storage capacitor through at least one via hole, and is electrically connected to the source contact region or the drain contact region of the driving transistor T1 through at least one via hole, so that the electrode plate of the storage capacitor is electrically connected to the active layer pattern of the driving transistor T1.

In the display panel 100 provided by the embodiments of the present disclosure, referring to FIGS. 5 and 6A, the first electrode plate C1 of the storage capacitor Cst located in the first gate conductive layer 13 is in direct contact with and electrically connected to the active layer pattern 121 of the driving transistor T1. Compared with the related art, there is no need to provide at least one connection pattern located on the source-drain conductive layer 15 and at least two via holes for connecting the above connection pattern and the active layer pattern 121 of the driving transistor T1, that is, there is no need to provide the pattern represented by M1 in FIG. 4 and the two via holes connected to the pattern represented by M1. Furthermore, patterns of the source-drain conductive layer 15 is simplified, which is beneficial to reducing an area of an orthogonal projection of the pixel driving circuit 20 on the substrate 11, thereby reducing a volume of the pixel driving circuit 20 and improving the pixel density of the display panel 100. That is, the pixel driving circuit included in the display panel 100 provided by the embodiments of the present disclosure may be suitable for manufacturing the display panel 100 with high pixel density.

Figure 6B:
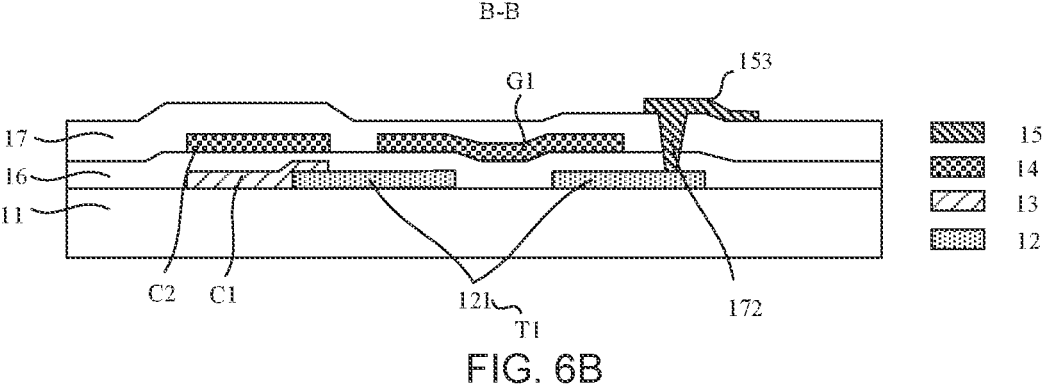
FIG. 6B is another sectional view of the pixel driving circuit in FIG. 5 taken along the line B-B.

In some embodiments, as shown in FIGS. 6A and 6B, an orthogonal projection of the first electrode plate C1 on the substrate 11 partially overlaps with an orthogonal projection of the active layer pattern 121 of the driving transistor T1 on the substrate 11. That is, a portion of the first electrode plate C1 and a portion of the active layer pattern 121 of the driving transistor T1 that are in contact with each other overlap with each other. Thus, the connection reliability between the first electrode plate C1 and the active layer pattern 121 of the driving transistor T1 is high, and the structure of the pixel driving circuit 20 is stable.

In some embodiments, the first electrode plate C1 and the active layer pattern 121 of the driving transistor T1 are in contact with each other in a surface perpendicular to a thickness direction of the substrate 11. In this way, the semiconductor layer 12 is not stacked with the first gate conductive layer 13, which is beneficial to reducing the thickness of the display panel 100. However, the processing accuracy of the first gate conductive layer 13 and the semiconductor layer 12 is required to be high.

In some embodiments, referring to FIG. 6A, the orthogonal projection of the first electrode plate C1 on the substrate 11 partially overlaps with the orthogonal projection of the active layer pattern 121 of the driving transistor T1 on the substrate 11. That is, a portion of the first electrode plate C1 is stacked with a portion of the active layer pattern 121 of the driving transistor T1.

The portion, whose orthogonal projection on the substrate 11 overlapping with the orthogonal projection of the active layer pattern 121 of the driving transistor T1 on the substrate 11, of the first electrode plate C1 is located on a side of the active layer pattern 121 of the driving transistor T1 proximate to the substrate 11. That is, the portion of the first electrode plate C1 stacked with the active layer pattern 121 of the driving transistor T1 is located on the side of the active layer pattern 121 of the driving transistor T1 proximate to the substrate 11.

In the manufacturing process of the display panel 100, after the second gate conductive layer 14 is fabricated, a portion of the semiconductor layer 12 that is not covered by the second gate conductive layer 14 needs to be doped by using the second gate conductive layer 14 as a mask, so that the doped portion forms a conductor. The first electrode plate C1 is located on a side of the active layer pattern 121 of the driving transistor T1 proximate to the substrate 11, which may prevent the first electrode plate C1 from adversely affecting the above process.

In some embodiments, referring to FIG. 6B, the portion, whose orthogonal projection on the substrate 11 overlapping with the orthogonal projection of the active layer pattern 121 of the driving transistor T1 on the substrate 11, of the first electrode plate C1 may be located on a side of the active layer pattern 121 of the driving transistor T1 away from the substrate 11. That is, the portion of the first electrode plate C1 stacked with the active layer pattern 121 of the driving transistor T1 is located on the side of the active layer pattern 121 of the driving transistor T1 away from the substrate 11.

In some embodiments, referring to FIGS. 3 and 5, the pixel driving circuit 20 further includes a first initialization transistor T2. The first initialization transistor T2 is electrically connected to an electrode plate of the storage capacitor Cst and the source contact region S1 or the drain contact region D1 of the driving transistor T1. The first initialization transistor T2 is configured to initialize the driving transistor T1 and the electrode plate of the storage capacitor Cst in the reset phase of a frame cycle.

Figure 6C:
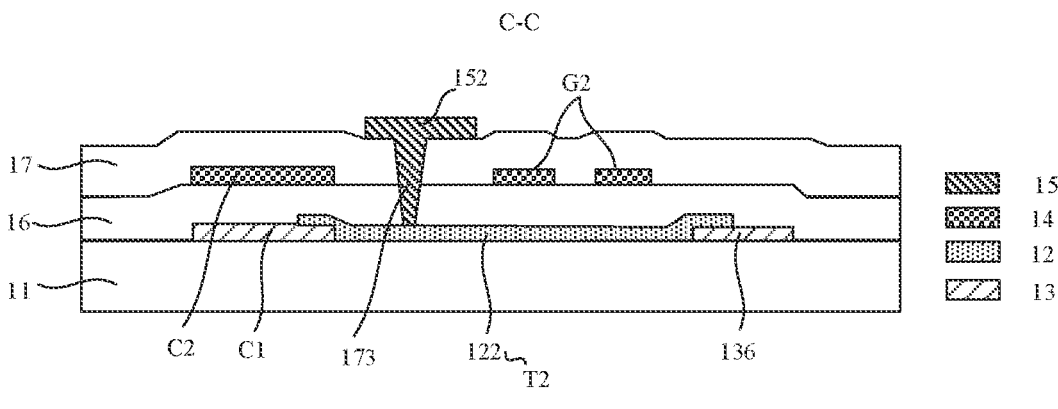
FIG. 6C is a sectional view of the pixel driving circuit in FIG. 5 taken along the line C-C.
Figure 10B:
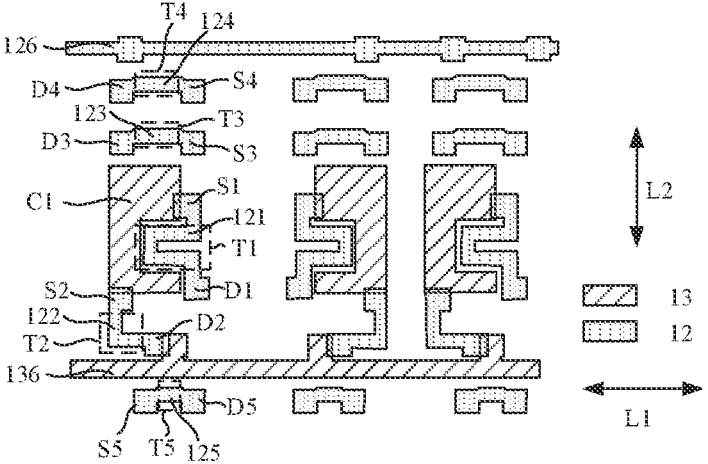
FIG. 10B is a schematic diagram showing a step of fabricating a semiconductor layer of a display panel.

Referring to FIGS. 6C and 10B, the semiconductor layer 12 further includes an active layer pattern 122 of the first initialization transistor T2. At least part of the active layer pattern 122 of the first initialization transistor T2 and at least part of the first electrode plate C1 are disposed in a same layer, and the active layer pattern 122 of the first initialization transistor T2 is in direct contact with and electrically connected to the first electrode plate C1. For example, a portion of the source contact region S2 of the first initialization transistor T2 is stacked with a portion of the first electrode plate C1.

The active layer pattern 122 of the first initialization transistor T2 and the active layer pattern 121 of the driving transistor T1 are both in direct contact with and electrically connected to the first electrode plate C1 of the storage capacitor Cst, so that the active layer pattern 122 of the first initialization transistor T2 is electrically connected to the active layer pattern 121 of the driving transistor T1 through the first electrode plate C1. For example, referring to FIG. 10B, the source contact region S2 of the first initialization transistor T2 is electrically connected to the first electrode plate C1 of the storage capacitor Cst, and the first electrode plate C1 of the storage capacitor Cst is further electrically connected to the source contact region S1 of the driving transistor T1, so that the source contact region S2 of the active layer pattern 122 of the first initialization transistor T2 is electrically connected to the source contact region S1 of the active layer pattern 121 of the driving transistor T1 through the first electrode plate C1.

Referring to FIGS. 5 and 6C, the first electrode plate C1 of the storage capacitor Cst located in the first gate conductive layer 13 is in direct contact with and electrically connected to the active layer pattern 122 of the first initialization transistor T2. Compared with the related art (comparing FIG. 4 and FIG. 5), in the pixel driving circuit of the embodiments of the present disclosure, there is no need to provide a via hole at the position M2 in FIG. 4, so that a size of a second connection pattern 152 may be reduced, which is beneficial to reducing the area of the orthogonal projection of the pixel driving circuit 20 on the substrate 11; as a result, the volume of the pixel driving circuit 20 is reduced and the pixel density of the display panel 100 is increased.

In some embodiments, the orthogonal projection of the first electrode plate C1 on the substrate 11 partially overlaps with an orthogonal projection of the active layer pattern 122 of the first initialization transistor T2 on the substrate 11.

Referring to FIG. 6C, a portion, whose orthogonal projection on the substrate 11 overlapping with the orthogonal projection of the active layer pattern 122 of the first initialization transistor T2 on the substrate 11, of the first electrode plate C1 is located on a side of the active layer pattern 122 of the first initialization transistor T2 proximate to the substrate 11.

The connection manner and relative positional relationship between the first electrode plate C1 and the active layer pattern 122 of the first initialization transistor T2 are respectively similar to those between the first electrode plate C1 and the active layer pattern 121 of the driving transistor T1, and thus their specific implementations and beneficial effects that can be achieved will not be repeated here.

In some embodiments, referring to FIGS. 5 and 6A, the display panel 100 further includes a source-drain conductive layer 15, a first insulating layer 16 and a second insulating layer 17. The source-drain conductive layer 15 is disposed on a side of the second gate conductive layer 14 away from the substrate 11, and includes a first connection pattern 151. The first insulating layer 16 is disposed between the second gate conductive layer 14 and both the semiconductor layer 12 and the first gate conductive layer 13. The second insulating layer 17 is disposed between the second gate conductive layer 14 and the source-drain conductive layer 15, and the second insulating layer 17 is provided with a plurality of first via holes 171 therein. The first connection pattern 151 is electrically connected to the second electrode plate C2 through at least one first via hole 171. A portion, covering the active layer pattern 121 of the driving transistor T1, of the second plate C2 forms the gate G1 of the driving transistor T1.

Referring to FIGS. 3, 5 and 10B, the pixel driving circuit 20 further includes a data writing transistor T3 and a second initialization transistor T4. Referring to FIGS. 5 and 10B, the first insulating layer 16 and the second insulating layer 17 are provided with a plurality of second via holes 172 therein. The first connection pattern 151 is electrically connected to a source contact region (a source) S3 or a drain contact region (a drain) D3 of an active layer pattern 153 of the data writing transistor T3 through at least one second via hole 172, and the first connection pattern 151 is electrically connected to a source contact region (a source) S4 or a drain contact region (a drain) D4 of the active layer pattern 124 of the second initialization transistor T4 through another at least one second via hole 172.

For example, the source contact region S3 of the data writing transistor T3 is electrically connected to the first connection pattern 151 through a second via hole 172, and the source contact region S4 of the second initialization transistor T4 is electrically connected to the first connection pattern 151 through a second via hole 172. That is, the source contact region S3 of the data writing transistor T3, the source contact region S4 of the second initialization transistor T4 and the second electrode plate C2 are electrically connected through the first connection pattern 151.

The data writing transistor T3 is electrically connected to the second electrode plate C2 of the storage capacitor Cst through the first connection pattern 151, and is configured to write a data voltage signal to the second electrode plate C2 of the storage capacitor Cst in the scanning phase; the light-emitting device 30 performs, according to the data voltage signal written into the second electrode plate C2 in the scanning phase, grayscale display in the light-emitting phase. The storage capacitor Cst is able to store and remain a voltage of the gate G1 of the driving transistor T1, so that the driving transistor T1 is turned on stably in the light-emitting phase, and the light-emitting device 30 continuously and stably emits light in the light-emitting phase of a frame cycle.

The second initialization transistor T4 is electrically connected to the second electrode plate C2 of the storage capacitor Cst through the first connection pattern 151, and is configured to initialize the voltage of the second electrode plate C2 of the storage capacitor Cst in the reset phase.

Referring to FIGS. 5 and 6C, the source-drain conductive layer 15 further includes the second connection pattern 152. The first insulating layer 16 and the second insulating layer 17 are provided with a plurality of third via holes 173 therein. The second connection pattern 152 is electrically connected to the source contact region S2 or the drain contact region (the drain) D2 of the active layer pattern 122 of the first initialization transistor T2 (in conjunction with FIG. 10B) through at least one third via hole 173. The second connection pattern 152 is configured to be electrically connected to the light-emitting device 30 of the display panel 100 (which is electrically connected to an anode).

For example, referring to FIG. 3, the source contact region (the source S) of the driving transistor T1 of the pixel driving circuit 20 is configured to be electrically connected to the light-emitting device 30. The active layer pattern 121 of the driving transistor T1 is electrically connected to the active layer pattern 122 of the first initialization transistor T2 through the first electrode plate C1; the second connection pattern 152 may be directly connected to the active layer pattern 121 (the drain contact region S1) of the driving transistor T1, or may be directly electrically connected to the active layer pattern 122 (the drain contact region S2) of the first initialization transistor T2.

Referring to FIGS. 3 and 5, the pixel driving circuit 20 further includes a control transistor T5. The control transistor T5 is configured to conduct a power supply signal line and the driving transistor T1 in the light-emitting phase of a frame cycle, thereby driving the light-emitting device 30 to emit light.

Referring to FIGS. 5 and 6A, the source-drain conductive layer further includes a third connection patterns 153, and the first insulating layer 16 and the second insulating layer 17 are further provided with a plurality of fourth via holes 174 therein. The third connection pattern 153 is electrically connected to a source contact region S5 or a drain contact region D5 of an active layer pattern 125 of the control transistor T5 (in conjunction with FIG. 10B) through at least one fourth via hole 174, and is electrically connected to the source contact region S1 or the drain contact region D1 of the active layer pattern 121 of the driving transistor T1 (in conjunction with FIG. 10B) through another at least one fourth via hole 174.

For example, referring to FIG. 5, the third connection pattern 153 is electrically connected to the source contact region S5 of the active layer pattern 125 of the control transistor T5 through a fourth via hole 174, and is electrically connected to the drain contact region D1 of the active layer patterns 121 of the driving transistor T1 through a fourth via hole 174.

In some embodiments, the plurality of sub-pixels 10 are arranged in a plurality of rows and a plurality of columns, each row of sub-pixels includes sub-pixels arranged in a first direction, and each column of sub-pixels includes sub-pixels arranged in a second direction. The first direction L1 is the horizontal direction in FIG. 5, and the second direction L2 is the vertical direction in FIG. 5.

Referring to FIG. 5, the source-drain conductive layer 15 further includes a voltage signal line VDD, data signal lines DL, a first initialization signal line VIN1 and a second initialization signal line VIN2 that each extending in the second direction L2.

Each column of sub-pixels 10 is electrically connected to a corresponding data signal line DL, and at least two columns of sub-pixels 10 are disposed between two adjacent voltage signal lines VDD, between two adjacent first initialization signal lines VIN1, and between two adjacent second initialization signal lines VIN2. For example, each pixel unit includes three sub-pixels 10, and the three sub-pixels are arranged in the first direction L1. Each sub-pixel 10 of the three sub-pixels 10 in a same pixel unit is electrically connected to a data signal line DL, and the three sub-pixels 10 in the same pixel unit share a voltage signal line VDD, a first initialization signal line VIN1 and a second initialization signal line VIN2. In this way, the number of wiring in the first direction is reduced, and the wiring space is saved, and it helps to reduce the space occupied by the pixel driving circuit 20, and thus the pixel density of the display panel 100 is improved. The three sub-pixels 10 are respectively electrically connected to three data signal lines DL, which are a first data signal line, a second data signal line, and a third data signal line.

In some embodiments, referring to FIG. 5, in order to electrically connect the voltage signal line VDD, the first initialization signal line VIN1 and the second initialization signal line VIN2 to each pixel driving circuit 20, the first gate conductive layer 13 further includes a first transition line 136 extending in the first direction L1, and the first transition line 136 is electrically connected to the first initialization signal line VIN1. The semiconductor layer 12 further includes a second transition line 126 extending in the first direction L1, and the second transition line 126 is electrically connected to the second initialization signal line VIN2. The second gate conductive layer 14 further includes a third transition line 146 extending in the first direction L1, and the third transition line 146 is electrically connected to the voltage signal line VDD.

Referring to FIG. 5, the source contact region S2 or the drain contact region D2 of the active layer pattern 122 of the first initialization transistor T2 (in conjunction with FIG. 10B) is electrically connected to the first transition line 136. The source contact region (the source) S3 or the drain contact region (the drain) D3 of an active layer pattern 123 of the data writing transistor T3 (in conjunction with FIG. 10B) is electrically connected to the data signal line DL. The source contact region S4 or the drain contact region D4 of the active layer pattern 124 of the second initialization transistor T4 (in conjunction with FIG. 10B) is electrically connected to the second transition line 126. The source contact region S5 or the drain contact region D5 of the active layer pattern 125 of the control transistor T5 (in conjunction with FIG. 10B) is electrically connected to the third transition line 146.

For example, the drain contact region D2 of the active layer pattern 122 of the first initialization transistor T2 is electrically connected to the first transition line 136. The drain contact region D3 of the active layer pattern 123 of the data writing transistor T3 is electrically connected to the data signal line DL. The drain contact region D4 of the active layer pattern 124 of the second initialization transistor T4 is electrically connected to the second transition line 126. The drain contact region D5 of the active layer pattern 125 of the control transistor T5 is electrically connected to the third transition line 146.

The active layer pattern 122 of the first initialization transistor T2 and the first transition line 136 are located in the same film layer. Referring to FIG. 5, the active layer pattern 122 of the first initialization transistor T2 may be in direct contact with and electrically connected to the first transition line 136; alternatively, referring to FIG. 7, the active layer pattern 122 of the first initialization transistor T2 is electrically connected to the first transition line 136 through a connection pattern provided in the source-drain conductive layer 15.

Figure 7:
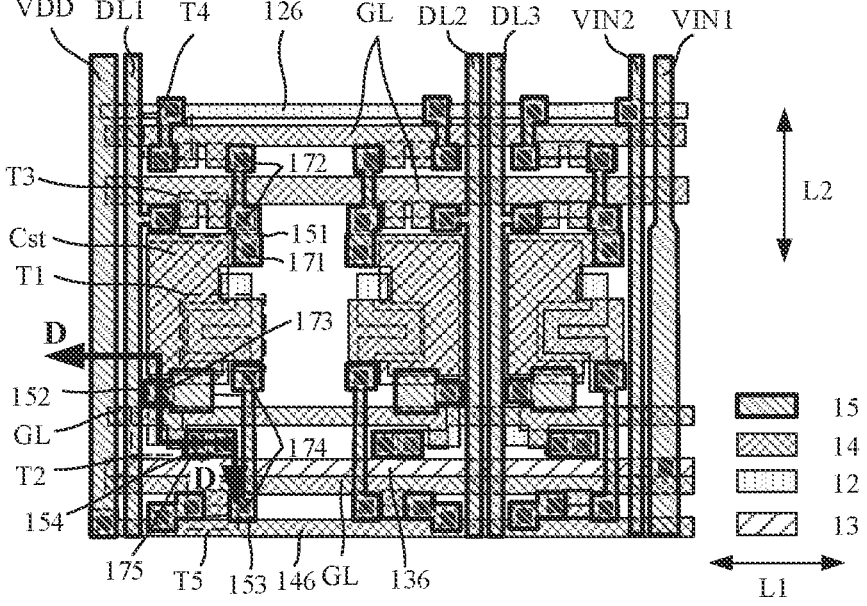
FIG. 7 is a layout of another pixel driving circuit, in accordance with some embodiments.
Figure 8:
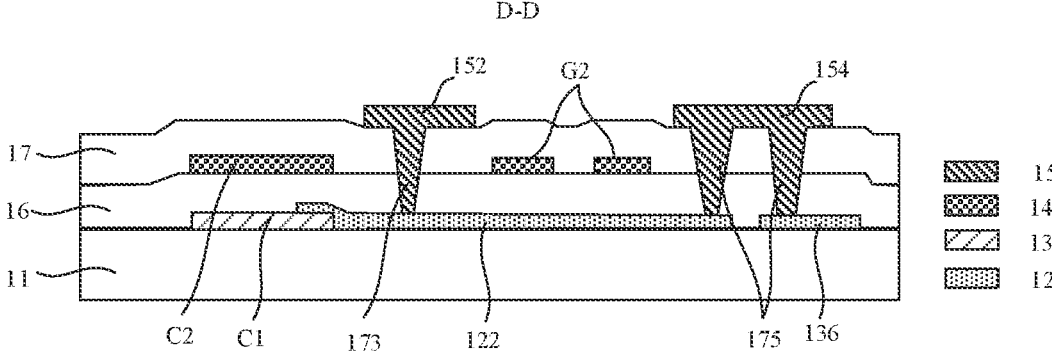
FIG. 8 is a sectional view of the pixel driving circuit in FIG. 7 taken along the line D-D.

In some embodiments, referring to FIGS. 7 and 8, in a case where the active layer pattern 122 of the first initialization transistor T2 and the first transition line 136 are electrically connected through the connection pattern provided in the source-drain conductive layer 15, the source-drain conductive layer 15 further includes a fourth connection pattern 154, and the first insulating layer 16 and the second insulating layer 17 are further provided with a plurality of fifth via holes 175 therein. The fourth connection pattern 154 is electrically connected to the first transition line 136 through at least one fifth via hole 175, and is electrically connected to the source contact region S2 or the drain contact region D2 of the active layer pattern 122 of the first initialization transistor T2 (in conjunction with FIG. 10B) through another at least one fifth via hole 175. In a case where there is a space between the active layer pattern 122 of the first initialization transistor T2 and the first transition line 136, the active layer pattern 122 of the first initialization transistor T2 may be electrically connected to the first transition line 136 through the forth connection pattern 154 and the fifth via hole 175.

In some embodiments, referring to FIGS. 5 and 6C, in a case where the active layer pattern 122 of the first initialization transistor T2 is in direct contact with and electrically connected to the first transition line 136, the source contact region S2 or the drain contact region D2 of the active layer pattern 122 of the first initialization transistor T2 (in conjunction with FIG. 10B) is in direct contact with and electrically connected to the first transition line 136.

Referring to FIGS. 5 and 6C, the active layer pattern 122 of the first initialization transistor T2 is in direct contact with and electrically connected to the first transition line 136. Compared with the related art (comparing FIG. 4 and FIG. 5), in the pixel driving circuit of the embodiments of the present disclosure, there is no need to provide a via hole at the position M3 in FIG. 4, which is beneficial to reducing the area of the orthogonal projection of the pixel driving circuit 20 on the substrate 11; as a result, the volume of the pixel driving circuit 20 is reduced and the pixel density of the display panel 100 is increased.

In some embodiments, referring to FIG. 2, the light-emitting device 30 is located on a side of a film layer where the pixel driving circuit 20 is located away from the substrate 11, and includes an anode 210, a light-emitting functional layer 22 and a cathode layer 23. The anode 210 of the light-emitting device 30 is electrically connected to the driving transistors in the plurality of thin film transistors TFT. A film layer in which the anode 210 is located is an anode layer 21.

The display panel 100 further includes a pixel defining layer 24 and an encapsulation layer 25, the pixel defining layer 24 includes a plurality of openings, and a light-emitting device 30 corresponds to an opening, and at least part of the light-emitting functional layer 22 of the light-emitting device 30 is disposed in a corresponding opening. The encapsulation layer 25 is located on a side of the cathode layer 23 away from the substrate 11, and the encapsulation layer 25 may be an encapsulation substrate or an encapsulation film, which is not specifically limited here.

The light-emitting function layer 22 of the light-emitting device 30 includes a light-emitting layer, and one or more layers of an electron transport layer (ETL), an electron injection layer (EIL), a hole transport layer (HTL), and a hole injection layer (HIL).

The display panel 100 further includes a transition layer 18 disposed between the source-drain conductive layer 14 and the anode layer 21, and the transition layer 18 includes a transition block 181. The transition block 181 is electrically connected to a source D1 of the driving transistor T1 through a via hole, and the anode 210 is electrically connected to the transition block 181 through a via hole. The source-drain conductive layer 14 and the anode layer 21 are provided with at least one insulating layer 19 therebetween. The transition layer 18 may reduce a depth of a via hole for connecting the anode 210 to the source-drain conductive layer 14, which improves the stability of the electrical connection between the anode 210 and the source-drain conductive layer 14, and reduces the process difficulty of fabricating the via hole (the via hole connecting the anode 210 and the source-drain conductive layer 14).

At least one insulating layer 19 includes a third insulating layer 191 (a first passivation layer) and a fourth insulating layer 192 (a first planarization layer) that are disposed between the source-drain conductive layer 14 and the transition layer 18. The fourth insulating layer 192 is located on a side of the third insulating layer 191 away from the substrate 11. The at least one insulating layer 19 further includes a fifth insulating layer 193 (a second passivation layer) and a sixth insulating layer 194 (a second planarization layer) that are disposed between the transition layer 18 and the anode layer 21. The sixth insulating layer 194 is located on a side of the fifth insulating layer 193 away from the substrate 11.

Some embodiments of the present disclosure further provide a method for manufacturing a display panel. The display panel includes a plurality of sub-pixels, the sub-pixel includes a pixel driving circuit, and the pixel driving circuit includes at least a driving transistor and a storage capacitor.

Referring to FIG. 9, the manufacturing method includes S100 to S300.

In S100, as shown in FIG. 10A, a first gate conductive layer 13 is fabricated on a substrate.

The first gate conductive layer 13 includes a first electrode plate C1 of a storage capacitor Cst.

In S200, as shown in FIG. 10B, a semiconductor layer 12 is fabricated on the substrate.

The semiconductor layer 12 includes an active layer pattern 121 of a driving transistor T1, and at least part of the first electrode plate C1 and at least part of the active layer pattern 121 of the driving transistor T1 are arranged in a same layer. The first electrode plate C1 is in direct contact with and electrically connected to the active layer pattern 121 of the driving transistor T1.

Figure 10C:
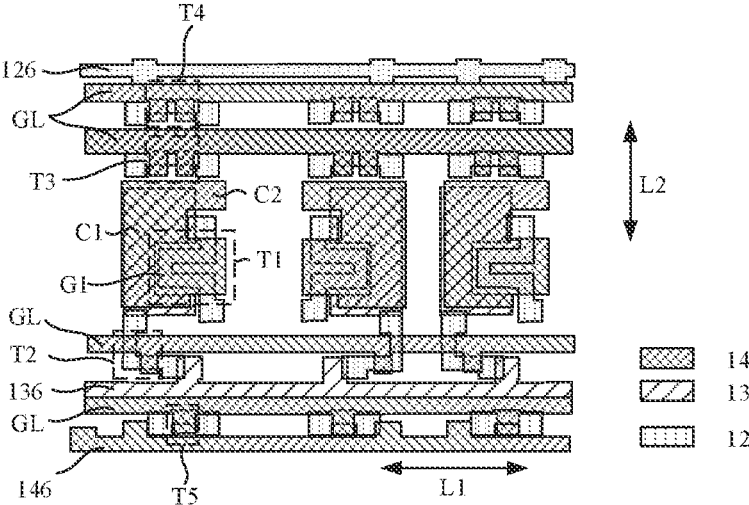
FIG. 10C is a schematic diagram showing a step of fabricating a second gate conductive layer of a display penal.

In S300, referring to FIG. 10C, a second gate conductive layer 14 is fabricated on a side of the first gate conductive layer 13 and the semiconductor layer 12 away from the substrate 11.

The second gate conductive layer 14 includes a second electrode plate C2 of the storage capacitor and a gate G1 of the driving transistor T1 electrically connected to the second electrode plate C2.

In some embodiments, referring to FIG. 9, after the second gate conductive layer 14 is fabricated on the side of the first gate conductive layer 13 and the semiconductor layer 12 away from the substrate 11 (S300), the manufacturing method further includes S400 and S500.

Figure 10D:
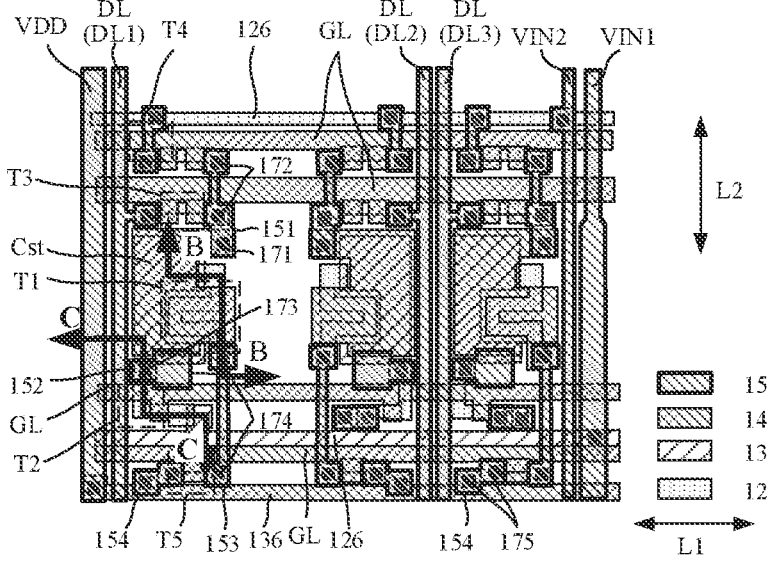
FIG. 10D is a schematic diagram showing a step of fabricating a source-drain conductive layer of a display panel.

In S400, referring to FIG. 10D, a source-drain conductive layer 15 is fabricated on a side of the second gate conductive layer 14 away from the substrate.

The source-drain conductive layer 15 includes a first connection pattern 151, a second connection pattern 152, a third connection pattern 153, a voltage signal line VDD, data signal lines DL, a first initialization signal line VIN1 and a second initialization signal line VIN2.

In S500, a light-emitting device 30 and an encapsulation layer 25 are fabricated on a side of the source-drain conductive layer 15 away from the substrate.

The light-emitting device 3 includes an anode 210, a light-emitting functional layer 22 and a cathode layer 21. The anode layer 21 of the light-emitting device 30 is electrically connected to the driving transistor T1 of a plurality of thin film transistors TFT. An encapsulation layer 25 is located on the side of the film layer where the light-emitting device 30 is located away from the substrate 11.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel comprising a plurality of sub-pixels, a sub-pixel including a pixel driving circuit, and the pixel driving circuit including at least a driving transistor and a storage capacitor; the display panel further comprising:

a substrate;

a first gate conductive layer disposed on the substrate and including a first electrode plate of the storage capacitor;

a semiconductor layer disposed on the substrate and including an active layer pattern of the driving transistor; at least part of the active layer pattern of the driving transistor and at least part of the first electrode plate being disposed in a same layer; and a second gate conductive layer disposed on a side of the first gate conductive layer and the semiconductor layer away from the substrate, and including a second electrode plate of the storage capacitor, and a gate of the driving transistor electrically connected to the second electrode plate;

wherein the pixel driving circuit further includes a first initialization transistor;

the semiconductor layer further includes an active layer pattern of the first initialization transistor; at least part of the active layer pattern of the first initialization transistor and the at least part of the first electrode plate are disposed in a same layer, and the active layer pattern of the first initialization transistor is in direct contact with and electrically connected to the first electrode plate; and the second gate conductive layer further includes a gate of the first initialization transistor.

2. The display panel according to claim 1, wherein the first electrode plate is in direct contact with and electrically connected to the active layer pattern of the driving transistor.

3. The display panel according to claim 2, wherein an orthogonal projection of the first electrode plate on the substrate partially overlaps with an orthogonal projection of the active layer pattern of the driving transistor on the substrate.

4. The display panel according to claim 3, wherein a portion, whose orthogonal projection on the substrate overlapping with the orthogonal projection of the active layer pattern of the driving transistor on the substrate, of the first electrode plate is located on a side of the active layer pattern of the driving transistor proximate to the substrate.

5. The display panel according to claim 3, wherein a portion, whose orthogonal projection on the substrate overlapping with the orthogonal projection of the active layer pattern of the driving transistor on the substrate, of the first electrode plate is located on a side of the active layer pattern of the driving transistor away from the substrate.

6. The display panel according to claim 1, wherein an orthogonal projection of the first electrode plate on the substrate partially overlaps with an orthogonal projection of the active layer pattern of the first initialization transistor on the substrate.

7. The display panel according to claim 6, wherein a portion, whose orthogonal projection on the substrate overlapping with the orthogonal projection of the active layer pattern of the first initialization transistor on the substrate, of the first electrode plate is located on a side of the active layer pattern of the first initialization transistor proximate to the substrate.

8. The display panel according to claim 1, further comprising:

a source-drain conductive layer disposed on a side of the second gate conductive layer away from the substrate; the source-drain conductive layer including a first connection pattern;

a first insulating layer disposed between the second gate conductive layer and both the semiconductor layer and the first gate conductive layer; and a second insulating layer disposed between the second gate conductive layer and the source-drain conductive layer; the second insulating layer being provided with a plurality of first via holes therein; wherein the first connection pattern is electrically connected to the second electrode plate through at least one first via hole.

9. The display panel according to claim 8, wherein the pixel driving circuit further includes a data writing transistor and a second initialization transistor; the semiconductor layer further includes: an active layer pattern of the data writing transistor including a source contact region and a drain contact region, and an active layer pattern of the second initialization transistor including a source contact region and a drain contact region; the first insulating layer and the second insulating layer are provided with a plurality of second via holes therein; and the first connection pattern is electrically connected to the source contact region or the drain contact region of the active layer pattern of the data writing transistor through at least one second via hole, and the first connection pattern is electrically connected to the source contact region or the drain contact region of the active layer pattern of the second initialization transistor through another at least one second via hole.

10. The display panel according to claim 8, further comprising a light-emitting device; wherein the first insulating layer and the second insulating layer are provided with a plurality of third via holes therein, and the active layer pattern of the first initialization transistor includes a source contact region and a drain contact region;

the source-drain conductive layer further includes:

a second connection pattern, the second connection pattern is electrically connected to the source contact region or the drain contact region of the active layer pattern of the first initialization transistor through at least one third via hole; the second connection pattern is configured to be electrically connected to the light-emitting device of the display panel.

11. The display panel according to claim 8, wherein the pixel driving circuit further includes a control transistor, the semiconductor layer further includes an active layer pattern of the control transistor including a source contact region and a drain contact region, the active layer pattern of the driving transistor includes a source contact region and a drain contact region, and the first insulating layer and the second insulating layer are provided with a plurality of fourth via holes; and the source-drain conductive layer further includes:

a third connection pattern, the third connection pattern is electrically connected to the source contact region or the drain contact region of the active layer pattern of the control transistor through at least one fourth via hole, and is electrically connected to the source contact region or the drain contact region of the active layer pattern of the driving transistor through another at least one fourth via hole.

12. The display panel according to claim 8, wherein the plurality of sub-pixels are arranged in a plurality of rows and columns, each row of sub-pixels includes sub-pixels arranged in a first direction, and each column of sub-pixels includes sub-pixels arranged in a second direction;

the source-drain conductive layer further includes voltage signal lines, data signal lines, first initialization signal lines and second initialization signal lines that each extend in the second direction; each column of sub-pixels are electrically connected to a corresponding data signal line, and at least two columns of sub-pixels are disposed between two adjacent voltage signal lines, between two adjacent first initialization signal lines, and between two adjacent second initialization signal lines;

the first gate conductive layer further includes a first transition line extending in the first direction, and the first transition line is electrically connected to a first initialization signal line;

the semiconductor layer further includes a second transition line extending in the first direction, and the second transition line is electrically connected to a second initialization signal line; and the second gate conductive layer further includes a third transition line extending in the first direction, and the third transition line is electrically connected to a voltage signal line.

13. The display panel according to claim 12, wherein the pixel driving circuit further includes a data writing transistor, a second initialization transistor, and a control transistor, and the semiconductor layer further includes: an active layer pattern of the data writing transistor, an active layer pattern of the second initialization transistor including a source contact region and a drain contact region, and an active layer pattern of the control transistor including a source contact region and a drain contact region; and the source contact region or the drain contact region of the active layer pattern of the first initialization transistor is electrically connected to the first transition line, and the source contact region or the drain contact region of the active layer pattern of the data writing transistor is electrically connected to the data signal line, and the source contact region or the drain contact region of the active layer pattern of the second initialization transistor is electrically connected to the second transition line; the source contact region or the drain contact region of the active layer pattern of the control transistor is electrically connected to the third transition line.

14. The display panel according to claim 13, wherein the first insulating layer and the second insulating layer are provided with a plurality of fifth via holes therein; the source-drain conductive layer further includes:

a fourth connection pattern, the fourth connection pattern is electrically connected to the first transition line through at least one fifth via hole, and is electrically connected to the source contact region or the drain contact region of the active layer pattern of the first initialization transistor through another at least one fifth via hole.

15. The display panel according to claim 13, wherein the source contact region or the drain contact region of the active layer pattern of the first initialization transistor is in direct contact with and electrically connected to the third transition line.

16. A display apparatus comprising the display panel according to claim 1.

17. A method for manufacturing a display panel, the display panel including a plurality of sub-pixels, a sub-pixel including a pixel driving circuit, and the pixel driving circuit including at least a driving transistor and a storage capacitor; the manufacturing method comprising:

fabricating a first gate conductive layer on a substrate; the first gate conductive layer including a first electrode plate of the storage capacitor;

fabricating a semiconductor layer on the substrate; the semiconductor layer including an active layer pattern of the driving transistor, and at least part of the active layer pattern of the driving transistor and at least part of the first electrode plate being disposed in a same layer; and fabricating a second gate conductive layer on a side of the first gate conductive layer and the semiconductor layer away from the substrate; the second gate conductive layer including a second electrode plate of the storage capacitor and a gate of the driving transistor electrically connected to the second electrode plate;

wherein the pixel driving circuit further includes a first initialization transistor;

the semiconductor layer further includes an active layer pattern of the first initialization transistor; at least part of the active layer pattern of the first initialization transistor and the at least part of the first electrode plate are disposed in a same layer, and the active layer pattern of the first initialization transistor is in direct contact with and electrically connected to the first electrode plate; and the second gate conductive layer further includes a gate of the first initialization transistor.

* * * * *